US006856516B2

(12) United States Patent
Ernsberger et al.

(10) Patent No.: US 6,856,516 B2
(45) Date of Patent: Feb. 15, 2005

(54) BALL GRID ARRAY RESISTOR CAPACITOR NETWORK

(75) Inventors: Craig Ernsberger, Granger, IN (US); Steven N. Ginn, Granger, IN (US)

(73) Assignee: CTS Corporation, Elkhart, IN (US)

( * ) Notice: Subject to any disclaimer, the term of this patent is extended or adjusted under 35 U.S.C. 154(b) by 380 days.

(21) Appl. No.: 10/224,052

(22) Filed: Aug. 20, 2002

(65) Prior Publication Data

US 2004/0037058 A1 Feb. 26, 2004

(51) Int. Cl.[7] .................................................. H05K 7/06
(52) U.S. Cl. ........................ 361/763; 361/780; 361/782; 361/795; 333/185
(58) Field of Search ............................ 361/301.4, 306.1, 361/306.2, 306.3, 308.1, 303–305, 309–313, 321.1, 321.5, 322, 329, 734, 738, 763, 780, 782, 792–795, 320, 324, 325, 327, 328, 332; 333/172, 185; 338/309, 313, 320, 324, 325, 327, 328, 329, 332

(56) References Cited

U.S. PATENT DOCUMENTS

| 4,274,124 | A |   | 6/1981  | Feinberg |
| 5,495,387 | A | * | 2/1996  | Mandai et al. ............. 361/328 |
| 6,005,777 | A |   | 12/1999 | Bloom |
| 6,097,277 | A |   | 8/2000  | Ginn |
| 6,108,212 | A | * | 8/2000  | Lach et al. ................. 361/768 |
| 6,194,979 | B1 |  | 2/2001  | Bloom |
| 6,226,169 | B1 |  | 5/2001  | Naito |
| 6,243,253 | B1 |  | 6/2001  | DuPre |
| 6,252,177 | B1 |  | 6/2001  | Stoddard |
| 6,272,003 | B1 |  | 8/2001  | Schaper |
| 6,326,677 | B1 |  | 12/2001 | Bloom |
| 6,327,134 | B1 |  | 12/2001 | Kuroda |

\* cited by examiner

*Primary Examiner*—John B. Vigushin
(74) *Attorney, Agent, or Firm*—Mark P. Bourgeois

(57) ABSTRACT

A resistor-capacitor network for terminating transmission lines. The network includes a core of dielectric material. Capacitors are formed within the core from spaced apart electrode plates. Terminals extend from the electrode plates to a top surface of the core. The electrode plates are oriented perpendicular to the top surface. Ball pads are located on the top surface. Resistors are located on the top surface and are connected between the ball pads and terminals. Conductive spheres are attached to the ball pads.

43 Claims, 8 Drawing Sheets

BALL GRID ARRAY RESISTOR CAPACITOR NETWORK

BACKGROUND OF THE INVENTION

1. Field of the Invention

This invention pertains generally to transmission lines and networks, and more specifically to thick film type dissipating terminations that match the characteristic impedance of a transmission line.

2. Description of the Related Art

Transmission lines are used in a diverse array of electronic equipment to accommodate transmission of electrical or electronic signals. These signals may have a diverse set of characteristics, which might, for example, include direct or alternating currents, analog or digitally encoded content, and modulation of any of a diverse variety of types. Regardless of the characteristics of the signal, an ideal transmission line will conduct the signal from source to destination without altering or distorting the signal. Distance is inconsequential to this ideal transmission line, other than delays which might be characteristic of the transmission medium and the distance to be traversed.

At low frequencies and with direct current transmissions, many transmission lines perform as though they are nearly ideal, even over very great distances. Unfortunately, as the frequency of the signal increases, or as the frequency of component signals that act as a composite increases, the characteristics of most common transmission lines decay and signal transmission progressively worsens. This is particularly true when signals reach the radio frequency range or when transmission lines become longer. One common phenomenon associated with high frequency, long distance transmission lines is a loss of the signal's high frequency components and the introduction of extraneously induced interfering high frequency signals. Another common phenomenon is echo or line resonance, where a signal may be reflected from one end of the transmission line back to the other. This echo, in the case of analog voice signals, is commonly known as reverberation, which leads to the effect of one sounding like speech is emanating from within a barrel. The auditory reverberation within a barrel generates a sound similar to the sound after an electrical signal echoes within a transmission line. In the case of a digital pulse, the effect will lead to corrupted data, since additional pulses may be received that were not part of the original transmission, and reflected pulses may cancel subsequent pulses.

In a number of electrical and electronic fields, new circuitry is being developed that has ever increasing capability for higher frequencies. The benefits of these higher frequency components is realized in faster computer processing, in the case of data processing, or broader bandwidth transmissions which can carry more voice signals, more television and radio signals and other signals all over the same communications channel. However, as these communications channels utilize ever-increasing frequencies, the limitations of conventional transmission lines are accentuated. In the case of copper transmission lines, radiation from a signal conductor is dependent directly upon the transmission line length and relative proximity of adjacent signal conductors. So, for example, a long signal line adjacent to another long signal line causes trouble even at lower frequencies. The original telephone lines were twisted in a particular way to reduce signal coupling between separate telephone lines. This signal coupling was aptly referred to in the art by the phrase "cross-talk", since signals from one telephone conversation would cross the lines into a different telephone line, resulting in talking which crossed the wires improperly. Cross-talk, as aforementioned, is dependent in part upon the spacing between adjacent signal lines. One method of reducing cross-talk is to increase spacing between lines. Unfortunately, another objective in the field of electronics is reduction of the size of components and systems. Simply increasing the spacing often results in greater expense, and also slower overall systems operation speeds—defeating the benefits which were otherwise attained by operating at higher frequencies. Another disadvantage of increased spacing comes from signal radiation. When a copper transmission line is made longer, the conductor will radiate and receive more high frequency energy. So, it is desirable to keep transmission lines shorter, not longer as might otherwise be dictated by cross-talk factors.

To prevent echo within a transmission line, it is possible to terminate the line with a device which is referred to in the art as an energy dissipating termination. The termination must have an impedance which is designed to match the characteristic impedance of the transmission line as closely as possible over as many frequencies of interest as possible. Transmission lines generally have an impedance which is based upon the inductance of the conductor wire, capacitance with other signal lines and ground planes or grounding shields, and resistance intrinsic in the wire. With an appropriate transmission line, the sum of the individual impedance components is constant and described as the "characteristic impedance." To match the transmission line characteristic impedance over a wide frequency range, a termination must also address each of the individual impedance components. The effect of inductance is to increase impedance with increasing frequency, while capacitance decreases impedance with increasing frequency. Intrinsic resistance is independent of frequency.

In the particular field of data processing, transmission lines typically take the form of busses, which are large numbers of parallel transmission lines along which data may be transmitted. For example, an eight bit data bus will contain at least eight signal transmission lines that interconnect various components within the data processing unit. The data bus is actually a transmission line having to accommodate, with today's processor speeds, frequencies which are in the upper radio frequency band approaching microwave frequencies. These high frequency busses are, in particular, very susceptible to inappropriate termination and transmission line echo.

Terminations used for these more specific applications such as the data processor bus serve several purposes. A first purpose is to reduce echoes on the bus by resistively dissipating any signals transmitted along the bus. This first purpose is found in essentially all termination applications. A second purpose, more specific to data busses or other similar electronic circuitry, is to function as what is referred to in the art as a "pull-up" or "pull-down" resistor. The termination resistor will frequently be connected directly to either a positive power supply line or positive power supply plane, in which case the termination resistor is a "pull-up" resistor, or the resistor may be connected to either a negative or ground line or plane, in which case the resistor is referred to as a "pull-down" resistor. When no signal is present on the line, the voltage on the transmission line will be determined by the connection of the termination resistor to either a power supply line or a ground or common line. Circuit designers can then work from this predetermined bus voltage to design faster, more power-efficient components and circuits.

The prior art has attempted to address signal line termination in a number of ways which were suitable at lower operating speeds and frequencies, but which have not proven fully desirable as frequencies and components thereof increase. To address higher frequency signals, such as might be encountered in data processing computers, for example, smaller, more compact resistors are required. These resistors may be formed by one of several common processes. One such process is referred to as thin film, which might include vapor deposition techniques, sputtering, semiconductor wafer type processing, and other similar techniques. An example of a thin film component is found in U.S. Pat. No. 5,216,404 to Nagai et al. These thin film production techniques require special vacuum chambers that make sequential, continuous production difficult and expensive.

Thick film components, herein considered to be components that are formed from a layer of Cermet or dielectric material deposited upon a non-conductive substrate, are most commonly formed from screen printing techniques. Other processes may be used to form thick film components such as lamination, or from subtractive processes including etching. For the purposes of this application, thick films are defined as films formed when specially formulated pastes or inks are applied and fired or sintered onto a substrate in a definite pattern and sequence to produce a set of individual components, such as resistors and capacitors, or a complete functional circuit. The substrates can be either pre-fired or can be in a green un-fired state. The pastes are usually applied using a screen printing method and may typically have a thickness of from 0.5 to 1 mil or more, and are well known in the industry. Cermet materials are materials comprising ceramic or glass in combination with metal compositions, where the first three letters: CER & MET make the word CERMET.

TCR stands for Temperature Coefficient of Resistance, which is a measure of the amount of change in resistance over some temperature range. Sheet resistivity for the purposes of this disclosure is measured in the units of ohms per square. This will be considered herein to be the resistance of a 1 mil thick film of equal length and width.

Low TCR thick film resistors may be readily manufactured that are both durable and have excellent TCR. These resistors may have sheet resistances that vary from fractions of an Ohm to millions of Ohms per square with a TCR less than ±100 ppm/□C. The performance of these resistors is excellent, and they may be patterned and trimmed by laser ablation, mechanical methods or most simply by altering patterns in the screen to form very tight spirals. As a result of the many excellent characteristics of thick film materials, these materials are most desirably incorporated into transmission line terminations.

However, as frequencies increase, there is great demand to decrease the size of the components. For example, inductance increases with length. Therefore, to minimize inductance in the termination, signal lines should be kept as short as possible. Furthermore, shorter line lengths decrease the undesirable cross-talk described hereinabove. Stray capacitance should be minimized, since this stray capacitance is frequently variable with temperature due to temperature related variations in ordinary dielectrics.

In the prior art, transmission line terminations were initially constructed using large Cermet resistors which were formed by thick film techniques upon alumina (aluminum oxide) substrates. These components were then mounted into a circuit board in a Single-In-line Package (SIP) format.

Several examples of these components may be found in U.S. Pat. No. 3,280,378 to Brady et al, U.S. Pat. No 3,346,774 to Brady, U.S. Pat. No 3,492,536 to Di Girolamo et al, each assigned to the present assignee, and also U.S. Pat. Nos. 4,654,628 and 4,658,234 to Takayanagi, all which are incorporated herein by reference. Due to the SIP format, one termination conductor must extend up from the substrate to a resistor, but additionally a second termination must extend up from the substrate and fully pass around the full length of the resistor, finally extending over the top of the resistor and terminating thereto. As a result, the effective conductor lead length found in these SIP components must be greater than the actual resistor length, and in most cases several times the resistor length. As lead length increases, so does line inductance, which then increases impedance to the high frequency components. When the inductance is too great from lead length, the termination device will not match the transmission line, and echoes will be generated as aforementioned, thereby corrupting data transmission or diminishing analog signal quality.

A second type of cermet termination has been developed, commonly referred to in the art as a "chip" type component. A flat substrate has resistors and terminations patterned thereon, and, unlike the SIP configuration, the chip component is laid flat onto the substrate. One example of the chip type component is illustrated in U.S. Pat. No. 5,379,190, the contents of which are also incorporated herein by reference. Since the chip is flat on the substrate, the chip component itself has shorter lead lengths. However, there are several very pronounced disadvantages of these chip components. A first disadvantage is the amount of circuit board real-estate which is consumed by the component. One of the reasons for the SIP configuration was to use as little circuit board surface area as possible. Circuit board real-estate is precious for two reasons. First of all, when a component uses more of the surface, wires must travel further to get past the component. As aforementioned, this means that the transmission line lengths are greater and radiation and the potential for cross-talk are greater. In addition, the circuit board itself has a price per unit area, which must be added to the component cost in an amount equal to the amount of surface area taken by the component. Another serious drawback is that, while the chip component lead lengths are shorter, the actual line lengths may, in fact, be no shorter, depending upon where the lines are routed from the chip into the circuit board pattern. In other words, while the distance on the chip is shorter, the actual total line length may not be any shorter.

To retain the size advantages of the SIP components, Seffernick et al in U.S. Pat. No. 5,621,619, assigned to the present assignee and incorporated herein by reference, developed a DIP configuration of reduced size and spacing smaller than ordinarily obtainable with solder paste and thick film Cermet compositions. Nevertheless, there is a continuing demand for even smaller and higher frequency transmission line terminations.

One method of component attachment which has proven beneficial in higher frequencies is the Ball Grid Array (BGA) package. In this package, connection between a printed circuit board and the BGA component is achieved through the use of a number of solder balls. These balls are not limited to placement around the periphery of the device, as was the case in the chip resistors of the prior art, but instead the BGA has terminations distributed in the array across the entire package. As a result, the printed circuit board real-estate may be consumed by the connection (the BGA), making this type of connection comparable in real-estate economy to the earlier SIP designs. In addition, the circuitry may be connected directly through the component substrate to the BGA, meaning that lead lengths may be limited solely to the thickness of the component substrate. These resultant leads are generally much shorter even than the leads found on chip components. Examples of these BGA type terminations are found in U.S. Pat. No. 4,332,341 to Minetti; U.S. Pat. No 4,945,399 to Brown et al; U.S. Pat. No 5,539,186 to Abrami et al; U.S. Pat. No 5,557,502 Banerjee et al; and U.S. Pat. No 5,661,450 to Davidson. Each of these patents illustrate various types of BGA components and packages, the contents and teachings which are incorporated herein by reference. While each of these patents illustrate various components, including termination resistor arrays and capacitors, none illustrate a high density thick film type termination network which has the benefits of resistors and capacitors integrated therein. Yet, such a device is needed in the art to provide the characteristics which are desired for many different types of transmission lines, including but not limited to the analog and digital lines described hereinabove.

SUMMARY OF THE INVENTION

It is a feature of the invention to provide a high density resistor capacitor network utilizing the benefits of buried capacitors with top mounted resistors and a solder bump or sphere connection.

It is a feature of the invention to provide a resistor capacitor network that minimizes connection inductance from the network to a circuit board by keeping connection wiring as short as possible.

It is a feature of the invention to provide an economical solution to transmission line termination at high frequencies.

It is a feature of the invention to provide a termination device that includes one more capacitors formed by electrodes that are separated by a dielectric material. The dielectric material surrounds the electrodes such that a top surface, a bottom surface and side surfaces are defined. The electrodes are oriented perpendicular to the top and bottom surfaces. Several resistors are located on the top surface. The resistors have a first end and a second end. Several first ball pads are located on the top surface and are connected to the first ends. Several second ball pads are located on the top surface and are connected to the electrodes. A first electrical connection connects the second end to the electrodes. Solder spheres are attached to the ball pads.

Figure 1:
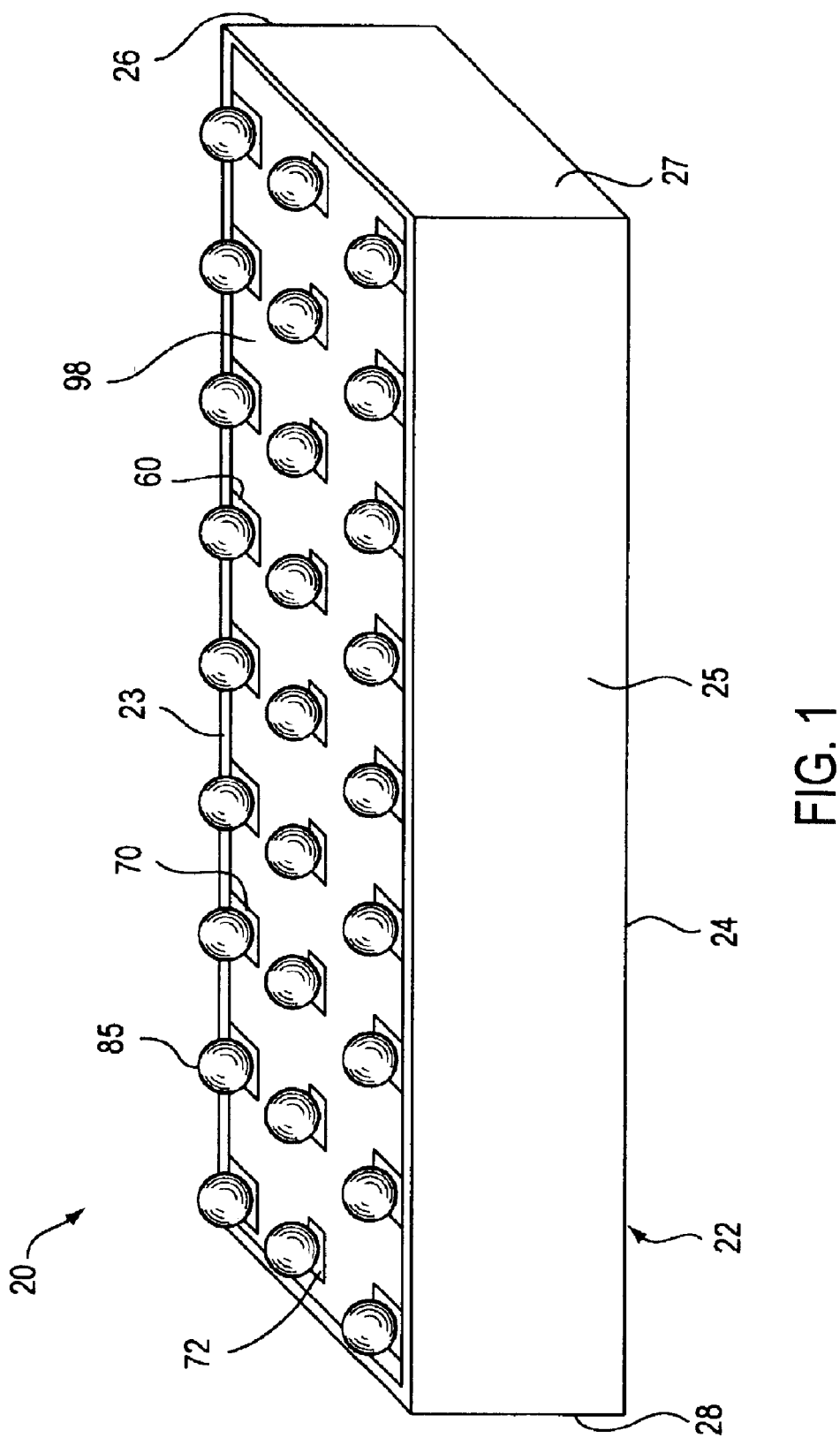
FIG. 1 is a perspective view of a ball grid array resistor capacitor network.
Figure 2:
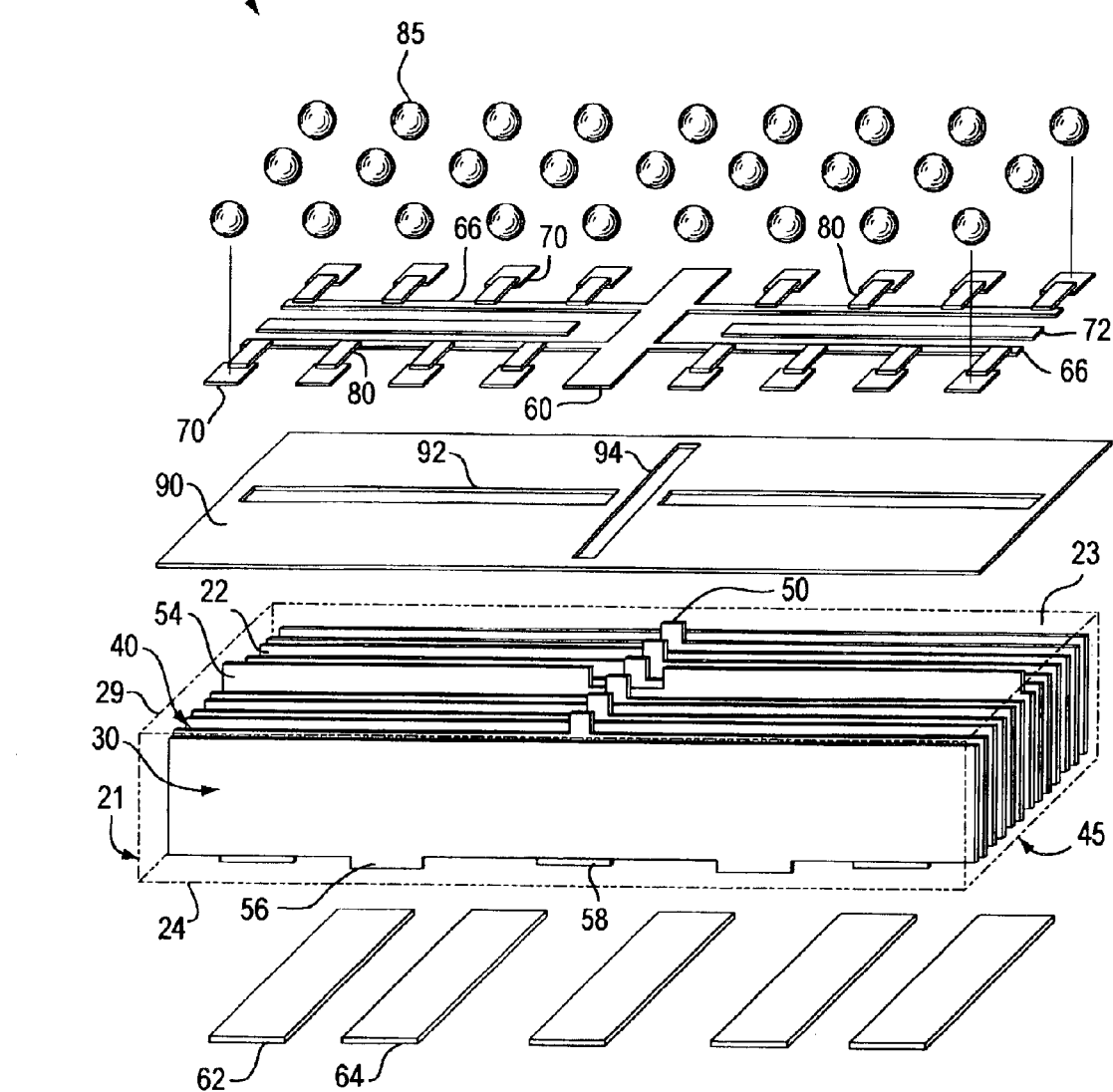
FIG. 2 is an exploded view of FIG. 1.
Figure 3:
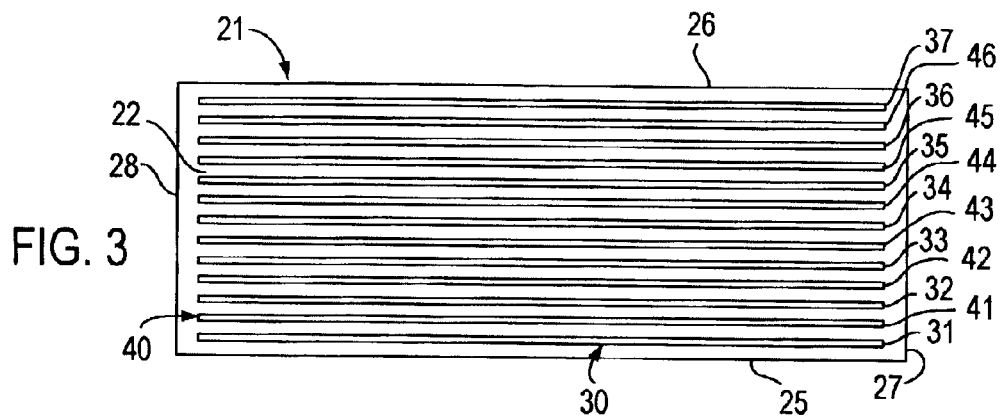
FIG. 3 is a top view of the core of FIG. 1 showing the electrode plates.
Figure 4:
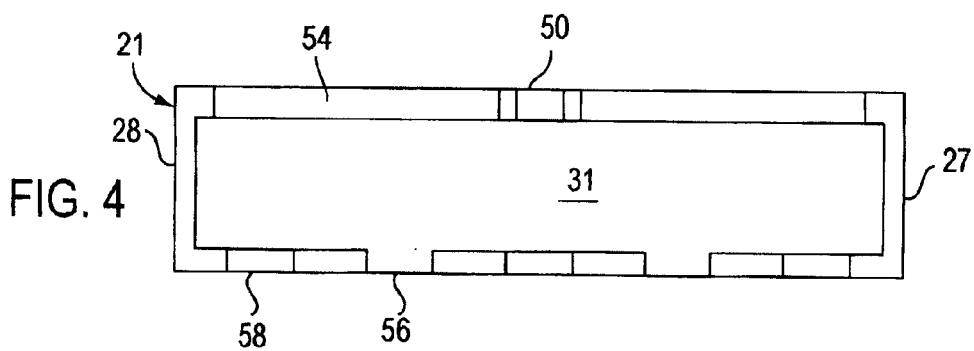
FIG. 4 is a side view of the core of FIG. 1 showing the electrode plates.
Figure 5:
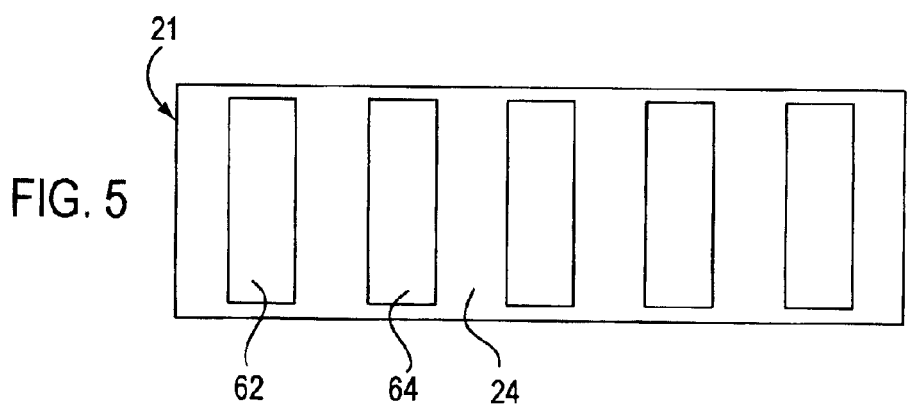
FIG. 5 is a bottom view of FIG. 1.
Figure 6:
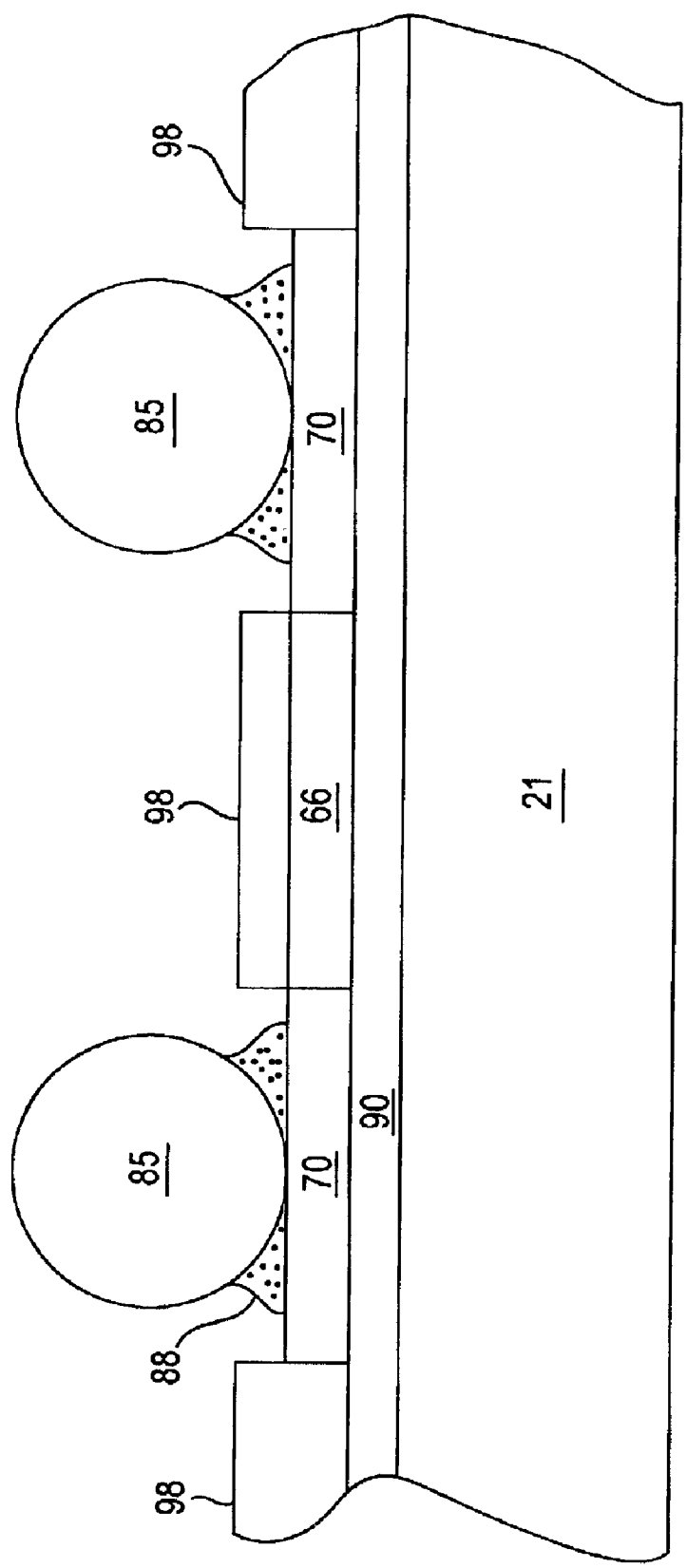
FIG. 6 is an enlarged side view of FIG. 1 showing details of the solder ball attachment.

It is noted that the drawings are not to scale.

Like components have been numbered as similarly as possible between drawings to simplify reference purposes.

DETAILED DESCRIPTION

Referring to FIGS. 1–7 , a Ball Grid Array Resistor Capacitor Network 20 is shown. Network 20 has a core of dielectric material 21 having a top 23, a bottom 24 and four side surfaces 25, 26, 27 and 28 having side surface interface edges 29. A first set of spaced apart electrode plates 30 is located within the core. First set of electrode plates 30 is composed of plates 31, 32, 33, 34, 35, 36 and 37. A second set of spaced apart electrode plates 40 is located within the core. Second set of electrode plates 40 is composed of plates 41, 42, 43, 44, 45 and 46. The first 30 and second 40 electrode plates are separated by a portion or layer 22 of dielectric core 21. The first and second set of electrode plates are arranged in an alternating manner within the core with a layer 22 of dielectric located between the plates. The electrode plates are oriented perpendicular to the top and bottom surfaces. This orientation provides a more compact package and allows a lower inductance connection to the termination bumps. The first and second set of electrode plates form capacitors 45 within the core.

The core 21 is formed by laminating multiple layers 22. Layers 22 are formed from a ceramic material in a green state and then fired in a oven. Barium Titanate is an example of one such ceramic material that can be used. A capacitor is formed when two electrodes are spaced by a dielectric material. As is known, the dielectric material may take any of a fairly wide variety of materials. However, in the thick film arena, titanates such as barium titanate are generally preferred due to their relatively high dielectric constants. Where lower value capacitors are deemed to be adequate for a particular application, other dielectrics such as oxides of silicon and aluminum may be adequate. The electrode plates are screen printed on each layer 22 from a metal paste. The metal paste can be palladium, gold, nickel, tungsten, molybdenum or other suitable metals. Details of the design and manufacture of such multi-layer capacitors are shown in U.S. Pat. Nos. 6,243,253 and 6,226,169. The contents of which are herein incorporated by reference.

Terminals 50 extend from the first set of electrodes 30 to top surface 23. Terminal 54 extends from electrode 34 to top surface 23. Terminals 56 extend from the first set of electrodes 30 to bottom surface 24. Terminals 58 extend from the second set of electrodes 40 to the bottom surface 24.

Buss bar 60 is located on top surface 23 and is electrically connected across terminals 50. A pair of circuit lines 66 extend on top surface 23 from buss bar 60 toward sides 27 and 28.

Buss bar 62 is located on bottom surface 24 and is electrically connected across terminals 58. Buss bar 64 is located on bottom surface 24 and is electrically connected across terminals 56. The buss bars and circuit lines are formed from conventional thick film conductor materials that are screened on.

Ball pads 70 are located on top surface 23. Another linear ball pad 72 is located on top surface 23 above terminals 54. Ball pads 72 are connected to terminals 54. Resistors 80 are located on top surface 23. The resistors 80 are connected between ball pads 70 and circuit lines 66. Resistors 80 are formed from conventional thick film resistor materials such as Ruthenium Oxide in a paste form that is screened. Other suitable resistor materials may also be used. Resistors 80 can be laser trimmed after they are fired in order to improve the accuracy of their resistance value.

Conductive bumps, spheres or balls 85 are attached to ball pads 70 and 72. Conductive spheres 85 are preferably made from a high melting point solder having a composition of 10% tin and 90% lead. Conductive bumps 85 can also be a solder paste that is reflowed into a hump or bump shape. The composition of the conductive spheres 85 can range from 80 to 95 percent lead and 5 to 20 percent tin. The conductive spheres 85 are held to ball pads 70 and 72 by a low temperature reflowed solder paste 88. The reflowed solder paste has a composition between 30 to 40 percent lead and 60 to 70 percent tin with a preferred composition of 63% tin and 37% lead.

By using a preformed conductor such as the conductive spheres illustrated, it is possible to achieve consistent dimensional control over the components, where a reflowed extension could be more difficult to control during manufacture. So while preforms are preferred, other methods of forming electrical attachment points to the terminators and networks of the present invention are contemplated and included herein, to the extent such terminations are known or would be obvious to those skilled in the art.

These conductive balls serve to electrically connect the ball pads to a mother board or other printed circuit or carrier substrate. These solder balls may be manufactured to be quite small, substantially only limited by the smallest sizes that may be produced. These balls may, in fact, be measured in thousandths or hundredths of an inch in diameter. Since all of surface 23 is covered by the ball grid array, there is no wasted surface real-estate on the carrier circuit board, such as a mother board, to which this component is attached. In addition, the signals that the ball pads interact with must only pass along a short lead length reducing inductance and cross-talk noise.

An optional dielectric layer 90 is shown located between dielectric core 21 and buss bar 60, pads 70, 72, circuit lines 66 and resistors 80. Dielectric layer 90 is screened or laminated on top surface 23 and is fired in an oven. Dielectric layer 90 is a chemically different material from core 21 and improves the mechanical properties such as adhesion of buss bar 60, pads 70, 72, circuit lines 66 and resistors 80 that are placed on top of layer 90. Layer 90 has openings or apertures 92 and 94. Terminals 50 extend through aperture 94. Terminals 54 extend through apertures 92. A cover coat 98 can be deposited over the resistors 80, buss bar 60 and circuit lines 66 in order to protect the resistors and conductors from corrosion. The cover coat is removed in FIG. 2 in order to show other features of the invention. Cover coat 98 would not cover pads 70 or portions of pads 72 and buss bar 60. A cover coat may also be placed over buss bars 62 and 64 on bottom surface 24.

Figure 7:
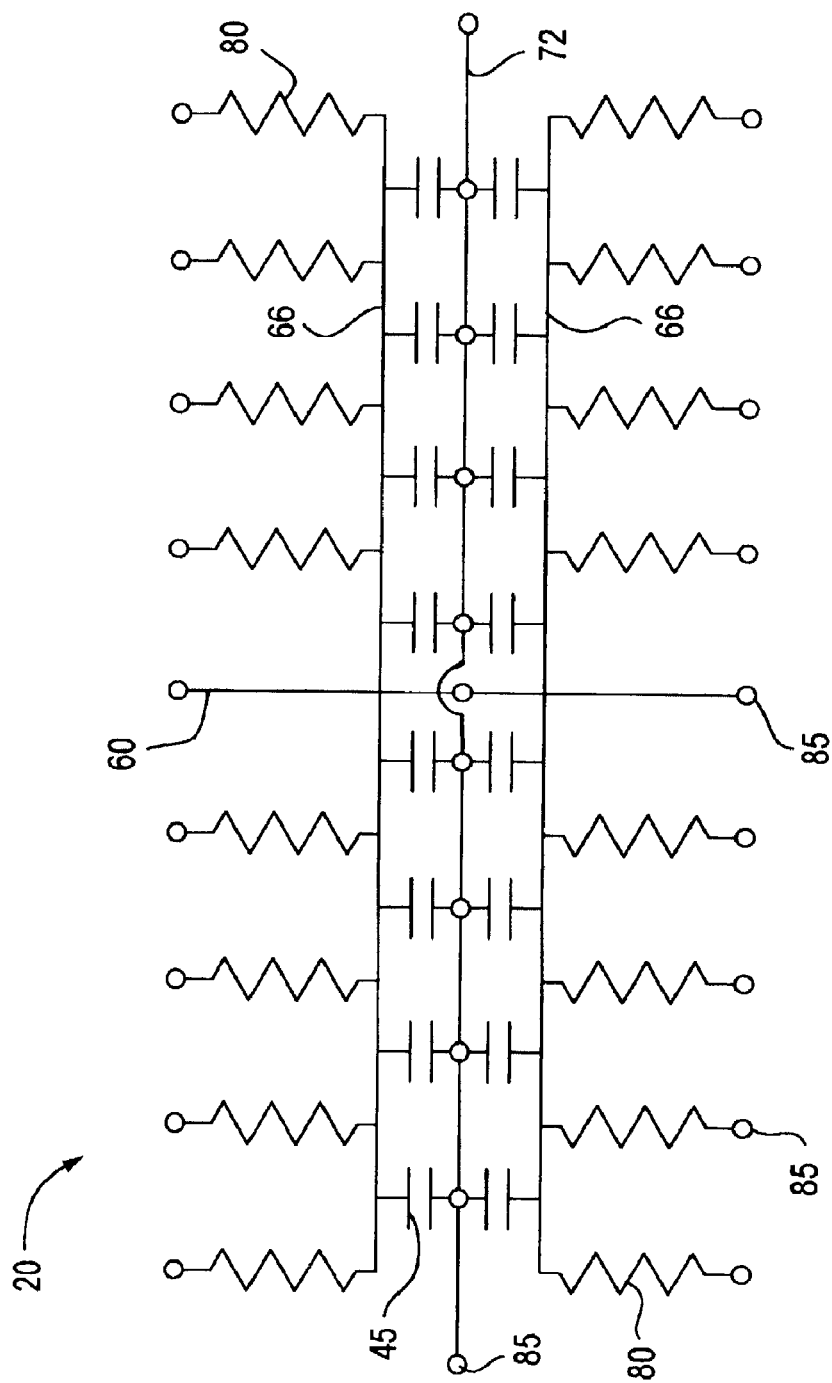
FIG. 7 is a schematic diagram of the circuit of FIG. 1.
Figure 8:
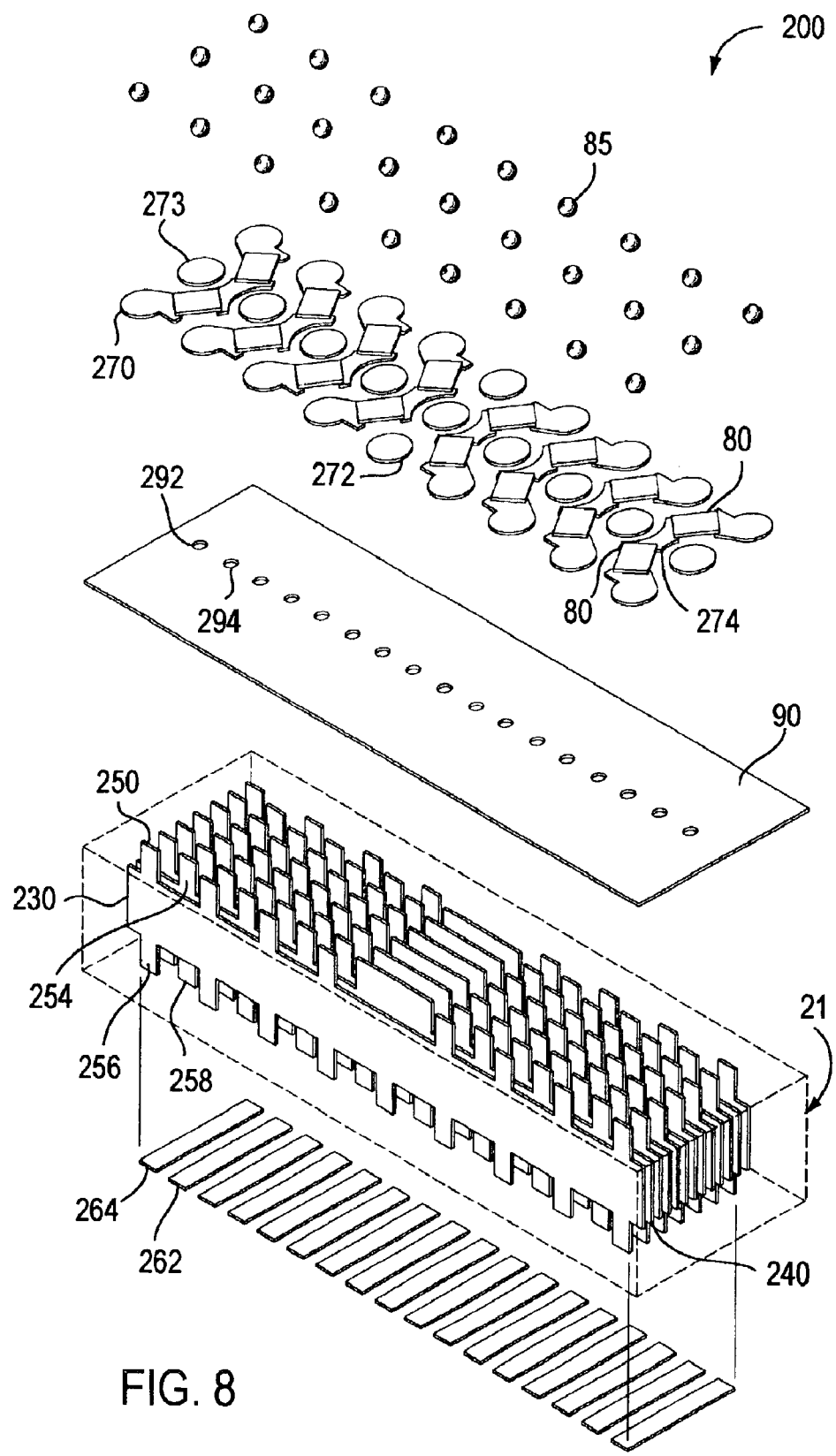
FIG. 8 is an exploded view of the preferred embodiment of a resistor capacitor network according to the present invention.
Figure 9:
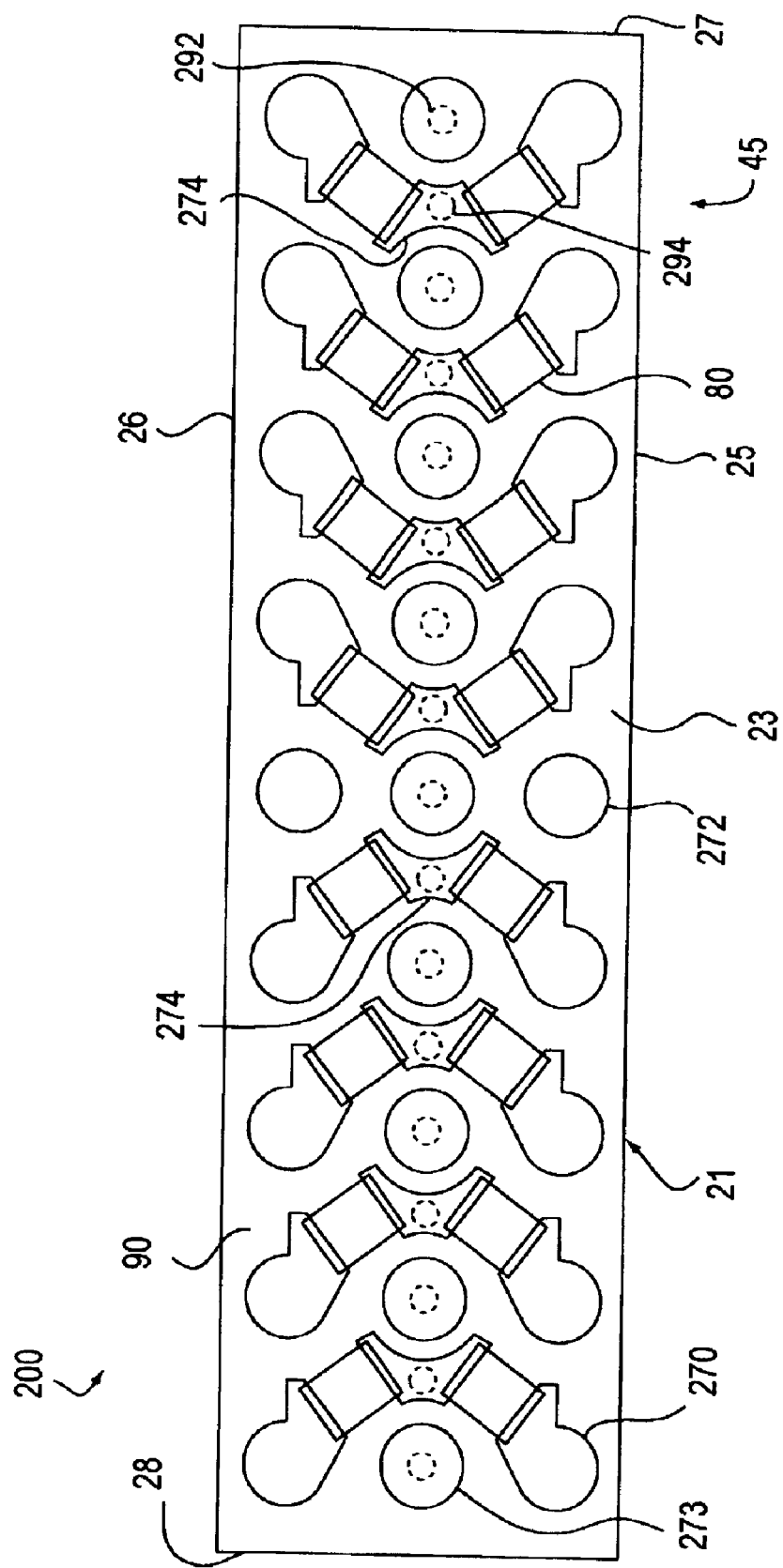
FIG. 9 is a top view of the FIG. 8.
Figure 10:
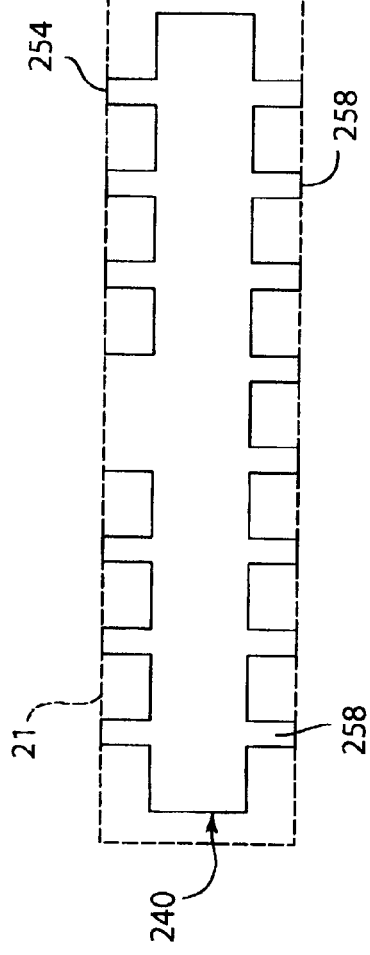
FIG. 10 is a side view of the core of FIG. 8 showing an electrode plate.
Figure 11:
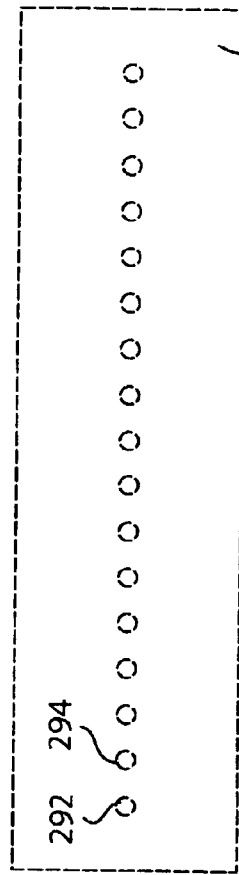
FIG. 11 is a top view of FIG. 8 showing the vias.
Figure 12:
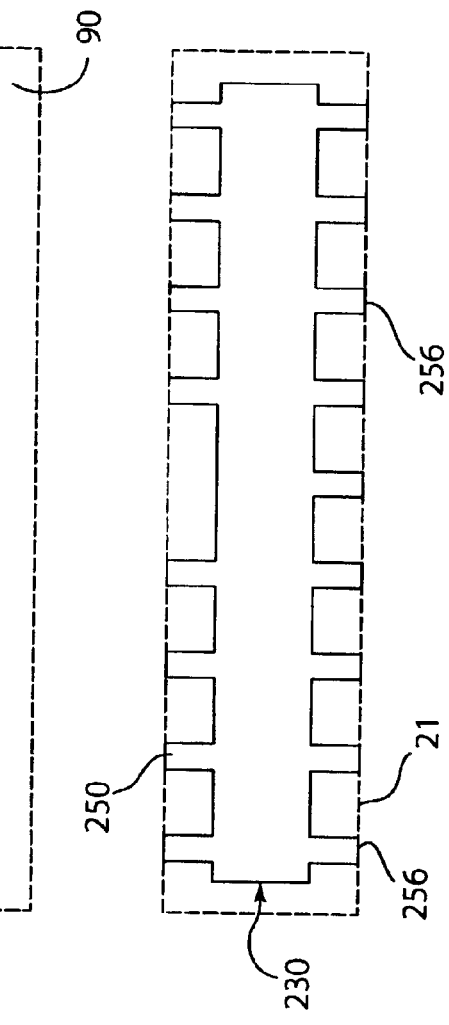
FIG. 12 is a side view of the core of FIG. 8 showing another electrode plate

Turning now to FIG. 7, a schematic diagram of the present invention is shown. It is noted that the capacitors have a common connection in pad 72 with capacitors located on each side of the connection. In addition, the resistors have one end commoned along circuit line 66. The network 20 provides a series connected resistor capacitor pair that can be used to terminate transmission lines and other electronic devices that require a matched termination that minimized reflections and has low inductance.

Referring to FIGS. 8–11, the preferred embodiment of a Ball Grid Array Resistor Capacitor Network 200 is shown. Network 200 is similar to network 20. Network 200 has a core of dielectric material 21 having a top 23, a bottom 24 and four side surfaces 25, 26, 27 and 28. A first set of spaced apart electrode plates 230 is located within the core. There can be 2 or more electrode plates 230. A second set of spaced apart electrode plates 240 is located within the core. There can be 2 or more electrode plates 240. As in FIG. 1, the first 230 and second 240 electrode plates are separated by a portion or layer 22 of dielectric core 21 (not shown in FIG. 8). The first and second set of electrode plates are arranged in an alternating manner within the core with a layer 22 of dielectric located between the plates. The electrode plates are oriented perpendicular to the top and bottom surfaces. This orientation provides a more compact package and allows a lower inductance connection to the termination bumps. The first and second set of electrode plates form capacitors 45 within the core. The core 21 is formed by laminating or printing multiple layers 22. Layers 22 are made from a high K ceramic material in a green state and then fired in a oven. Barium Titanate is an example of one such ceramic material that can be used. A capacitor is formed when two electrodes are spaced by a dielectric material. As is known, the dielectric material may take any of a fairly wide variety of materials. However, in the thick film arena, titanates such as barium titanate are generally preferred due to their relatively high dielectric constants. Where lower value capacitors are deemed to be adequate for a particular application, other dielectrics such as oxides of silicon and aluminum may be adequate. The electrode plates are screen printed on each layer 22 from a metal paste. The metal paste can be silver, platinum, palladium, gold, nickel, tungsten, molybdenum or other suitable metals.

Multiple terminals 250 extend from each of the first electrodes 230 to top surface 23. Multiple terminals 254 extend from each of the second set of electrodes 240 to top surface 23. The center terminal 254 is wider than the other terminals. Several terminals 256 extend from the first set of electrodes 230 to bottom surface 24. Several terminals 258 extend from the second set of electrodes 240 to the bottom surface 24.

A buss bar 262 is located on bottom surface 24 and is electrically connected across terminals 258. Buss bar 264 is located on bottom surface 24 and is electrically connected across terminals 256. The buss bars are formed from conventional thick film conductor materials that are screened on.

A dielectric layer 90 is located on top surface 23. Dielectric layer 90 is screened or laminated on top surface 23 and is fired or cured in an oven. Dielectric layer 90 is a chemically different material from core 21 and improves the mechanical properties such as adhesion of subsequent features that are placed on top of layer 90. Layer 90 also isolates the resistors and ball attach circuitry from the underlying capacitor. Layer 90 has vias 292 and 294 that are filled with a conductive material. Terminals 250 and 254 are electrically connected to vias 292 and 294, respectively.

Ball pads 270, 272 and 273 are located on layer 90. Ball pads 273 are connected to terminals 250 through vias 292. Resistors 80 are located on layer 90. Conductors 274 are located on layer 90 between two of resistors 80. Conductors 274 electrically connect the ends of two resistors 80. Conductor 274 is also electrically connected to via 294. Resistors 80 are formed from conventional thick film resistor materials such as Ruthenium Oxide in a paste form that is screened. Other suitable resistor materials may also be used. Resistors 80 can be laser trimmed after they are fired in order to improve the accuracy of their resistance value.

Conductive bumps, spheres or balls 85 are attached to ball pads 270, 272 and 273. Conductive spheres 85 are preferably made from a high melting point solder having a composition of 10% tin and 90% lead. Conductive bumps 85 can also be a solder paste that is reflowed into a hump or bump shape. The composition of the conductive spheres 85 can range from 80 to 95 percent lead and 5 to 20 percent tin. The conductive spheres 85 are held to ball pads 270, 272 and 273 by a low temperature reflowed solder paste 88. The reflowed solder paste has a composition between 30 to 40 percent lead and 60 to 70 percent tin with a preferred composition of 63% tin and 37% lead.

By using a preformed conductor such as the conductive spheres illustrated, it is possible to achieve consistent dimensional control over the components, where a reflowed extension could be more difficult to control during manufacture. So while preforms are preferred, other methods of forming electrical attachment points to the terminators and networks of the present invention are contemplated and included herein, to the extent such terminations are known or would be obvious to those skilled in the art.

These conductive balls serve to electrically connect the ball pads to a mother board or other printed circuit or carrier substrate. These solder balls may be manufactured to be quite small, substantially only limited by the smallest sizes that may be produced. These balls may, in fact, be measured in thousandths or hundredths of an inch in diameter. Since the entire surface is covered by the ball grid array, there is no wasted surface real-estate on the carrier circuit board, such as a mother board, to which this component is attached. In addition, the signals that the ball pads interact with must only pass along a short lead length reducing inductance and cross-talk noise.

A cover coat 98 (FIG. 1) can be deposited over the resistors 80, and conductors 274 in order to protect the resistors and conductors from corrosion. The cover coat is removed in FIG. 8 in order to show the features of the invention. Cover coat 98 would not cover ball pads 270, 272 or 273. A cover coat may also be placed over buss bars 262 and 264 on bottom surface 24.

While the figures illustrate possible constructions of the invention, variations are certainly possible. One possible variation is to connect the capacitors and resistors into a different circuit configuration than was shown. Resistors could also be placed on bottom surface 24 and be connected to the capacitors. Furthermore, it will be apparent that many different numbers of resistors and capacitors may be combined in accord with the present teachings for any given application, and particular numbers of components may lend special significance to only one or a few of the preferred specific applications.

While the foregoing details what is felt to be the preferred embodiment of the invention, no material limitations to the scope of the claimed invention are intended. Further, features and design alternatives that would be obvious to one of ordinary skill in the art upon a reading of the present disclosure are considered to be incorporated herein. The scope of the invention is set forth and particularly described in the claims hereinbelow.

We claim:

1. A resistor and capacitor network comprising:
   a) a core of dielectric material having a top, a bottom and four side surfaces having side surface interface edges;
   b) a first set of spaced apart electrode plates located within the core;
   c) a second set of spaced apart electrode plates located within the core, each of the first and second electrode plates being separated by a portion of the core, the first and second set of electrode plates arranged in an alternating manner within the core, the first and second set of electrode plates and core forming a plurality of capacitors within the core;
   d) a first terminal extending from the first set of electrodes toward the top surface;
   e) a second terminal extending from at least one of the second set of electrodes toward the top surface;
   f) a third terminal extending from the first set of electrodes toward the bottom surface;
   g) a fourth terminal extending from the second set of electrodes toward the bottom surface;
   h) a first buss bar located on the top surface and electrically connected between the first terminals
   i) a second buss bar located on the bottom surface and electrically connected between the third terminals;
   j) a third buss bar located on the bottom surface and electrically connected between the fourth terminals;
   k) a plurality of ball pads located on the top surface;
   l) a plurality of resistors formed on the top surface, the resistors connected between the ball pads and the first buss bar; and
   m) a plurality of conductive bumps attached to the ball pads.

2. The resistor and capacitor network of claim 1, wherein the conductive bumps are attached to the second terminal.

3. The resistor and capacitor network of claim 1, wherein a dielectric layer is located over the top surface, the ball pads and resistors located on the dielectric layer.

4. The resistor and capacitor network of claim 3, wherein the dielectric layer has a first opening located over the first terminals and a second opening located over the second terminal.

5. The resistor and capacitor network of claim 1, wherein the conductive bumps are solder spheres that are attached to the ball pads with a reflowed solder paste.

6. The resistor and capacitor network of claim 5, wherein the solder spheres are formed from a high temperature melting point solder.

7. The resistor and capacitor network of claim 6, wherein the reflowed solder paste is a low temperature melting point solder paste.

8. A resistor and capacitor network comprising:
   a) a core of dielectric material having a top, a bottom and four side surfaces;
   b) a plurality of capacitors formed within the core, the capacitors including a first set of spaced apart electrode plates located within the core, a second set of spaced apart electrode plates located within the core and a set of dielectric material layers each of the first and second electrode plates being separated by a dielectric material layer, the first and second set of electrode plates arranged in an alternating manner within the core;
   c) a first terminal extending from the first set of electrode plates to the top surface;
   d) a second terminal extending from at least one of the second set of electrode plates to the top surface;
   e) a first set of ball pads located on the top surface;
   f) a second set of ball pads attached to the second terminal;
   g) at least one resistor formed on the top surface, the resistor connected between one of the first set of ball pads and the first terminal; and
   h) a plurality of conductive spheres attached to the first and second set of ball pads.

9. The resistor and capacitor network of claim 8, wherein a third terminal extends from the first set of electrode plates to the bottom surface.

10. The resistor and capacitor network of claim 9, wherein a fourth terminal extends from the second set of electrode plates toward the bottom surface.

11. The resistor and capacitor network of claim 10, wherein a first buss bar is located on the top surface and electrically connected between the first terminals.

12. The resistor and capacitor network of claim 11, wherein a second buss bar is located on the bottom surface and electrically connected between the third terminals.

13. The resistor and capacitor network of claim 12, wherein a third buss bar is located on the bottom surface and electrically connected between the fourth terminals.

14. The resistor and capacitor network of claim 8, wherein a dielectric layer is located over the top surface, the ball pads and resistors located on the dielectric layer.

15. The resistor and capacitor network of claim 14, wherein the dielectric layer has a first opening located over the first terminals and a second opening located over the second terminal.

16. The resistor and capacitor network of claim 8, wherein the conductive spheres are attached to the ball pads with a reflowed solder paste.

17. The resistor and capacitor network of claim 16, wherein the conductive spheres are formed from a solder having a composition of 80 to 95 percent lead and 5 to 20 percent tin.

18. The resistor and capacitor network of claim 16, wherein the reflowed solder paste has a composition of 30 to 40 percent lead and 60 to 70 percent tin.

19. The resistor and capacitor network of claim 8, wherein the resistors are laser trimmed.

20. The resistor and capacitor network of claim 8, wherein a cover coat covers the resistors.

21. The resistor and capacitor network of claim 8, wherein the resistors are thick film resistors.

22. A termination device comprising:
   a) at least one capacitor formed from a plurality of electrodes separated by a dielectric material, the dielectric material surrounding the electrodes such that a top surface, a bottom surface and side surfaces are defined, the electrodes oriented perpendicular to the top and bottom surfaces;
   b) a plurality of resistors located on the top surface, the resistors having a first end and a second end;
   c) a plurality of first ball pads located on the top surface and connected to the first ends;
   d) a plurality of second ball pads located on the top surface and connected to the electrodes; and
   e) a plurality of first electrical connections connecting the second ends to the electrodes.

23. The device of claim 22, wherein the electrodes further comprise:
   a) a first set of spaced apart electrode plates; and
   b) a second set of spaced apart electrode plates.

24. The device of claim 23, wherein the first and second set of electrode plates are arranged in an alternating manner.

25. The device of claim 24, wherein a first terminal extends from the first set of electrode plates to the top surface.

26. The device of claim 25, wherein a second terminal extends from one of the second set of electrode plates to the top surface.

27. The device of claim 26, wherein the second ball pads are connected to the second terminal.

28. The device of claim 22, wherein a plurality of conductive spheres are attached to the first and second ball pads.

29. The device of claim 27, wherein a third terminal extends from the first set of electrode plates to the bottom surface.

30. The device of claim 29, wherein a fourth terminal extends from the second set of electrode plates to the bottom surface.

31. The device of claim 30, wherein a second buss bar is located on the bottom surface and is connected between the third terminals.

32. The device of claim 31, wherein a third buss bar is located on the bottom surface and is connected between the fourth terminals.

33. The device of claim 26, wherein a dielectric layer is located over the top surface, the ball pads and resistors located on the dielectric layer.

34. The device of claim 33, wherein the dielectric layer has a first via located over the first terminal and a second via located over the second terminal.

35. The device of claim 28, wherein the conductive spheres are attached to the ball pads with a reflowed solder paste.

36. A termination device comprising:
   a) a capacitor formed from a plurality of electrodes separated by a dielectric material, the dielectric material surrounding the electrodes such that a top surface, a bottom surface and side surfaces are defined, the electrodes oriented perpendicular to the top and bottom surfaces;
   b) a dielectric layer located over the top surface;
   c) a plurality of conductive vias extending through the dielectric layer and electrically connected to the electrodes;
   d) at least two resistors located on the dielectric layer, the resistors having a first end and a second end;
   e) a conductor located on the dielectric layer and connected between the first ends, the conductor further connected to the via;
   f) a plurality of first ball pads located on the dielectric layer and connected to the second ends;
   g) a plurality of second ball pads located on the dielectric layer and connected to the vias; and
   h) a plurality of conductive bumps attached to the first and second ball pads.

37. The device of claim 36, wherein the electrodes further comprise:
   a) a first set of spaced apart electrode plates; and
   b) a second set of spaced apart electrode plates.

38. The device of claim 37, wherein the first and second set of electrode plates are arranged in an alternating manner.

39. The device of claim 38, wherein a first terminal extends from the first set of electrode plates to the via.

40. The device of claim 38, wherein a second terminal extends from the second set of electrode plates to the via.

41. The device of claim 38, wherein a third terminal extends from the first set of electrode plates to the bottom surface.

42. The device of claim 38, wherein a fourth terminal extends from the second set of electrode plates to the bottom surface.

43. The device of claim 36, wherein the conductive bumps are conductive spheres that are attached to the ball pads with a reflowed solder paste.

* * * * *